March 24, 1970 J. WADE 3,502,903

SIGNAL-CONTROLLED ATTENUATOR WITH FIELD-EFFECT TRANSISTORS
FOR MAINTAINING CONSTANT ALTERNATING SIGNAL

Filed Aug. 21, 1967

INVENTOR
JOHN WADE
BY A. C. Smith
ATTORNEY

United States Patent Office 3,502,903
Patented Mar. 24, 1970

3,502,903

SIGNAL - CONTROLLED ATTENUATOR WITH FIELD-EFFECT TRANSISTORS FOR MAINTAINING CONSTANT ALTERNATING SIGNAL

John Wade, Glendora, Calif., assignor to Hewlett-Packard Company, Palo Alto, Calif., a corporation of California Filed Aug. 21, 1967, Ser. No. 661,879
Int. Cl. G06g 7/12
U.S. Cl. 307—230 6 Claims

ABSTRACT OF THE DISCLOSURE

A signal circuit includes a signal-controlled attenuator which responds to the amplitude of applied alternating signal for providing a constant amplitude alternating signal output over a wide dynamic range of applied signal amplitude. The circuitry for controlling the attenuator also provides a D.C. current which is proportional to the amplitude of applied alternating signal.

SUMMARY OF THE INVENTION

An attenuator uses of pair of field-effect transistors (FET's) connected in parallel across an alternating signal conductor. The resistance of the field-effect transistors are controlled by applied gate signals to maintain the alternating signal across the parallel pair substantially constant.

DESCRIPTION OF THE PREFERRED EMBODIMENT

Figure 1:
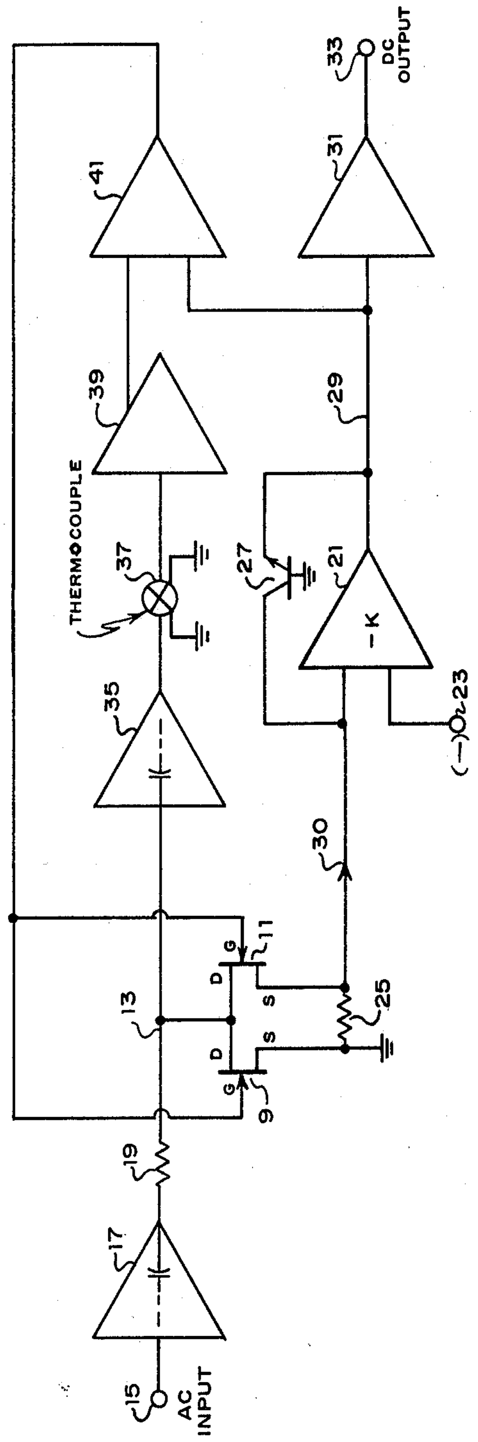
FIGURE 1 is a schematic diagram of the circuit of the present invention and FIGURE 2 is a graph showing the relationship between field-effect transistor control signal and the attenuator resistance.

In accordance with the illustrated embodiment of the present invention a pair of field-effect transistors 9 and 11 are connected in parallel for alternating signal appearing on conductor 13. Alternating signal appearing at input terminal 15 is amplified by the A.C.-coupled amplifier 17 and is applied to the conductor 13 through resistor 19. The effects of nonlinearities in the high resistance regions of the $V_{DS}$ vs. $I_D$ curves for field-effect transistors are avoided by biasing one field-effect transistor for current conduction in one direction and by biasing the other field-effect transistor for conduction of current in the reverse direction as bias current flows from ground through the transistors 9 and 11 and the input of amplifier 21 to the bias supply terminal 23. The incremental or dynamic resistance measured from conductor 13 to signal ground is thus a linear function of the D.C. resistance measured from source to source regardless of whether a field-effect transistor is operating nonlinear resistance region.

The alternating signal from amplifier 17 is attenuated by the combination of resistor 19 and the parallel-connected FET's 9 and 11, controlled by means later described, so that the amplitude of alternating signal on conductor 13 is substantially constant. A constant voltage, say 20 millivolts supplied at bias supply terminal 23, is maintained across the two equal attenuator resistors, (i.e., the FET's 9 and 11) in series. The series resistance of the two FET's can therefore be easily measured by noting the current flow in the input of operational amplifier 21. Since the attenuator is automatically set by means described later so that the alternating signal on conductor 13 is a constant value regardless of input, it can be seen that the resistance of the FET's 9 and 11 must vary inversely with input signal and that the current in the input of amplifier 21 must vary directly with input signal. The relation between input voltage and current in the input of amplifier 21 is not quite linear and becomes quite nonlinear as the parallel resistance of the two FET's 9 and 11 approaches the value of resistor 19. However, a resistor 25 having a value equal to four times the value of resistor 19 is connected across the serially-connected FET's 9 and 11 to supply an amount of current to the input of amplifier 21 such that this current, along with the current which passes through the FET's 9 and 11, provides a total current which is linearly proportional to the input signal. This holds true even when the parallel resistance of the FET's 9 and 11 is approximately equal to the value of resistor 19.

In the discussion, it is assumed that the two halves of the attenuator are equal in resistance. The reason this must be true is that the measurement of the series resistance of the two halves must bear some relation to the parallel resistance which actually provides the attenuation. If the resistances of the two halves were equal, the relation would be a constant 4. An investigation reveals, however, that the two halves may be mismatched considerably without affecting the constant 4 very much. In fact, a 20% mismatch between the attenuator halves makes only a 1% change in the constant 4. This permits the use of randomly-selected FET's which are very closely matched over the wide dynamic resistance range required.

The operational amplifier 21 has a feedback circuit connected from its output to its input with a common base transistor 27 connected in the feedback circuit with the emitter of transisor 27 connected to the output of amplifier 21 and with the collector of transistor 27 connected to the virtual ground node thus formed at the input of the amplifier 21. The circuit produces an output voltage on line 29 which is a logarithmic function of input current. Log amplifiers of this type are described in the literature (see U.S. Patent 3,237,028). This log amplifier circuit thus changes the current through the FET's 9 and 11 to a voltage on line 29 by the relation $V_{BE}=k \log I_c$, where $V_{BE}$ is the voltage between base and emitter of transistor 27 and, hence, the voltage on line 29 and $I_c$ is the collector current of transistor 27 and, hence, for an amplifier 21 having an infinite input impedance, the current in conductor 30. The output voltage on line 29 may thus be considered to be inversely proportional to the log of the series FET's resistance, a fact made use of in the control circuitry described later. The signal on line 29 may be amplified in amplifier 31 to provide the correct scale and to provide a D.C. output at terminal 33 which is proportional to the log of the true RMS value of the input signal applied at terminal 15.

The alternating signal on conductor 13 is amplified by the main amplifier 35 and is applied to a thermocouple 37. The thermocouple 37 produces a D.C. output proportional to the true RMS value of the alternating signal applied thereto from amplifier 35. This D.C. is compared with a reference voltage, say ground, and any difference is amplified and fed back to the FET's 9 and 11 which adjust resistance value to attenuate the alternating signal level so that the difference between the thermocouple output and the reference voltage is reduced to zero. There are two amplifiers in the feedback path. The first is the frequency-compensation amplifier 39 which serves to control the loop time response and which provides a selected loop response determined by the lowest frequency of alternating signal with which the converter is to be used. The second amplifier is the FET driver amplifier 41.

Figure 2:
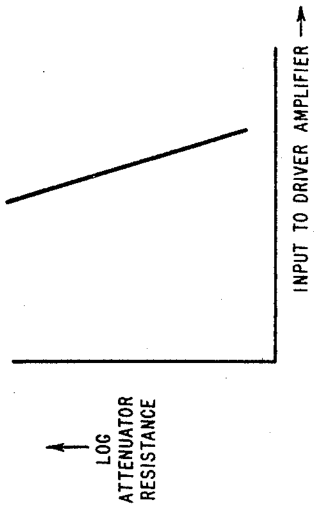

Loop stability considerations determine that it is desirable that the attenuator transfer characteristic be as shown in FIGURE 2. This logarithmic characteristic is required so that the loop gain remains constant over the range of resistance values of FET's 9 and 11. The transfer characteristic shown in FIGURE 2 is produced by providing a signal path from the output line 29 of the log amplifier circuit to the input of the driver amplifier. The combination of this signal and the amplified signal from the thermocouple 37 is thus amplified by driver amplifier 41 and is applied to the gate electrodes of FET's 9 and 11 so that the source-to-drain resistance vs. the gate-to-source voltage transfer characteristic of the FET's 9 and 11 does not affect the constant signal level on conductor 13 or affect the loop gain of the present circuit as the level of applied signal at terminal 15 varies over the operating range.

I claim:

1. A signal circuit comprising:
an input terminal for receiving applied signal;
a first field-effect transistor having source, drain and gate electrodes;
means including a resistor connecting the source-drain electrode circuit path of said transistor to said input terminal;
a thermocouple element having an input for producing a direct-current signal at an output thereof in response to signal applied to input thereof;
means connected to the input of said element for applying signal thereto from a point intermediate the resistor and the source-drain electrode circuit path of said transistor; and
circuit means responsive to the direct-current signal at the output of said element to apply control signal to said gate electrode for altering the resistance of the source-drain electrode circuit path of said transistor in proper sense to maintain the signal level at said point substantially constant over a range of signal levels of signal applied to said input terminal.

2. A signal circuit as in claim 1 comprising:
a second field-effect transistor having source, drain and gate electrodes;
means connecting the source-drain electrode circuit paths of the first and second transistors in parallel for signal appearing at said point; and
said circuit means applying said control signal to the gate electrode of the first and second transistors.

3. A signal circuit as in claim 2 comprising:
means connected to supply direct current serially through the source-drain electrode circuit paths of the first and second transistors; and
current-responsive means connected to be responsive to the direct current conducted serially through the source-drain electrode circuit paths of the first and second transistros to produce an output signal having an amplitude related to the direct current serially conducted through the source-drain electrode circuit paths of said first and second transistors.

4. A signal circuit as in claim 3 comprising:
another resistor connected in shunt with the serially-connected source-drain electrode circuit paths of the first and second transistors, the resistance of said other resistor being approximately four times the resistance of said resistor.

5. A signal circuit as in claim 3 wherein:
said current-responsive means produces an output signal proportional to the logarithm of direct current serially conducted through the source-drain electrode circuit paths of the first and second transistors.

6. A signal circuit as in claim 5 wherein:
said circuit means applies to the gate electrodes of the first and second transistors a control signal related to the combination of said output signal and the direct-current signal at the output of said element.

References Cited

UNITED STATES PATENTS 3,386,053 5/1968 Priddy ---------- 307—304 X

OTHER REFERENCES

Pub. I: "Field Effect Transistor as Linear Variable Resistance," by W. Y. Elliott, Jr., in IBM Technical Disclosure Bulletin, vol. 7, No. 1, June 1964, p. 111.

DONALD D. FORRER, Primary Examiner

S. D. MILLER, Assistant Examiner

U.S. Cl. X.R.

307—237, 304; 328—145; 333—81